United States Patent
Tanaka

(10) Patent No.: US 7,374,985 B2
(45) Date of Patent: May 20, 2008

(54) LASER IRRADIATION APPARATUS AND METHOD FOR MANUFACTURING SEMICONDUCTOR DEVICE

(75) Inventor: Koichiro Tanaka, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 315 days.

(21) Appl. No.: 10/989,341

(22) Filed: Nov. 17, 2004

(65) Prior Publication Data
US 2005/0111497 A1    May 26, 2005

(30) Foreign Application Priority Data
Nov. 20, 2003  (JP)  ............... 2003-390573

(51) Int. Cl.
H01L 21/20    (2006.01)

(52) U.S. Cl. ............. 438/166; 438/487; 438/96

(58) Field of Classification Search ........... 438/166, 438/487, 795–798; 117/3–10, 200; 219/121.65
See application file for complete search history.

(56) References Cited

U.S. PATENT DOCUMENTS

| | | | |
|---|---|---|---|
| 5,959,779 A | 9/1999 | Yamazaki et al. | |
| 6,002,523 A | 12/1999 | Tanaka | |
| 6,104,535 A | 8/2000 | Tanaka | |
| 6,176,926 B1 | 1/2001 | Tanaka | |
| 6,215,595 B1 | 4/2001 | Yamazaki et al. | |
| 6,239,913 B1 | 5/2001 | Tanaka | |
| 6,310,727 B1 | 10/2001 | Tanaka | |
| 6,388,812 B2 | 5/2002 | Yamazaki et al. | |
| 6,567,219 B1 | 5/2003 | Tanaka | |
| 6,587,277 B2 | 7/2003 | Yamazaki et al. | |
| 6,689,651 B2 | 2/2004 | Zhang et al. | |
| 7,011,709 B2* | 3/2006 | Taniguchi et al. | 117/200 |
| 7,101,436 B2* | 9/2006 | Taniguchi et al. | 117/200 |
| 7,245,802 B2* | 7/2007 | Tanaka | 385/31 |
| 2002/0009839 A1 | 1/2002 | Zhang et al. | |
| 2004/0036969 A1* | 2/2004 | Taniguchi et al. | 359/443 |
| 2005/0111105 A1* | 5/2005 | Tanaka | 359/619 |
| 2005/0170569 A1* | 8/2005 | Yazaki et al. | 438/155 |
| 2007/0139660 A1* | 6/2007 | Tanaka et al. | 356/614 |

FOREIGN PATENT DOCUMENTS

JP    08-088196    4/1996

* cited by examiner

*Primary Examiner*—Savitri Mulpuri
(74) *Attorney, Agent, or Firm*—Eric J. Robinson; Robinson Intellectual Property Law Office, P.C.

(57) ABSTRACT

The linear laser beam generally has a width of 1 mm or less, and it is necessary to adjust the optical system with high accuracy in order to form the laser beam having such a narrow width and having a homogeneous intensity distribution. The adjustment of the optical system requires a large amount of time, and the laser irradiation apparatus using this optical system cannot be used during the adjustment of the optical system. This causes the throughput to decrease. The present invention is made to facilitate a readjustment of the optical system and to shorten the time required for it. When the misalignment of the laser beam is corrected to keep the incident position in the optical system the same by moving the laser beam parallel with the use of a single optical element, it is no longer necessary to readjust all the optical elements, and therefore the time can be saved.

28 Claims, 13 Drawing Sheets

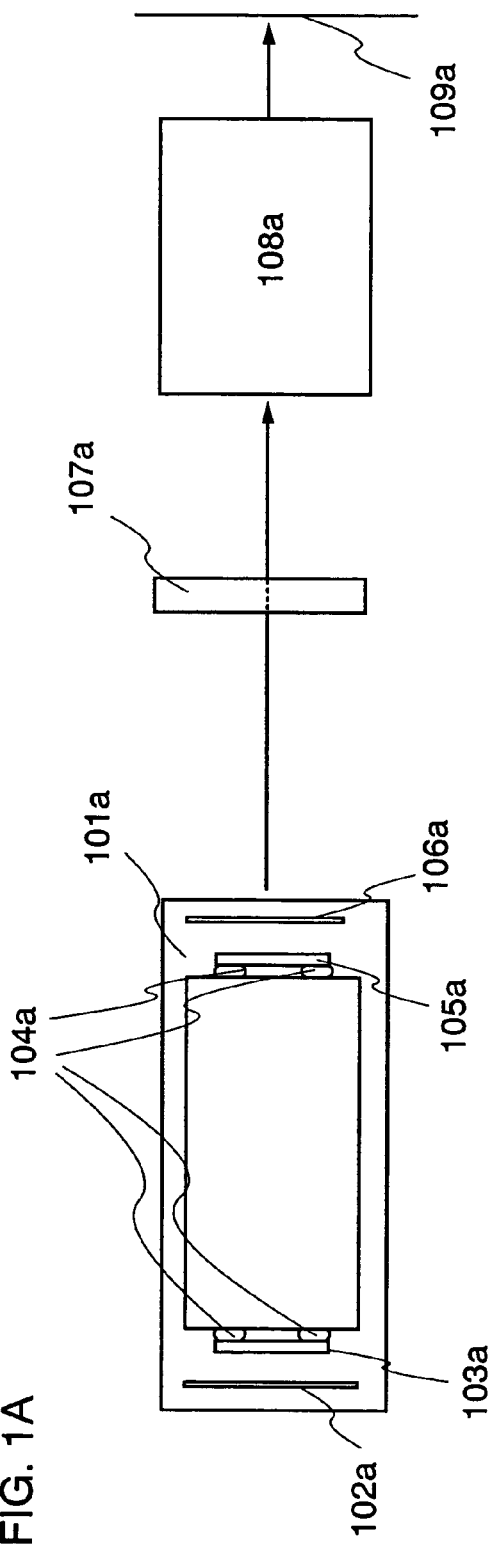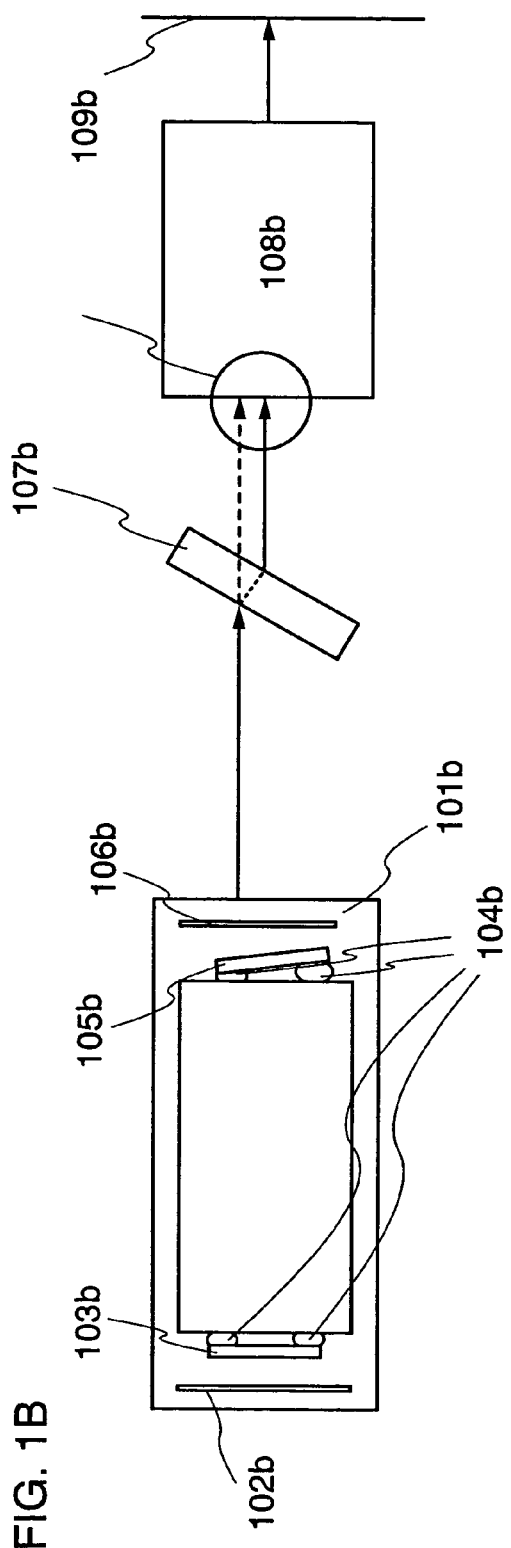
FIG. 1A
FIG. 1B

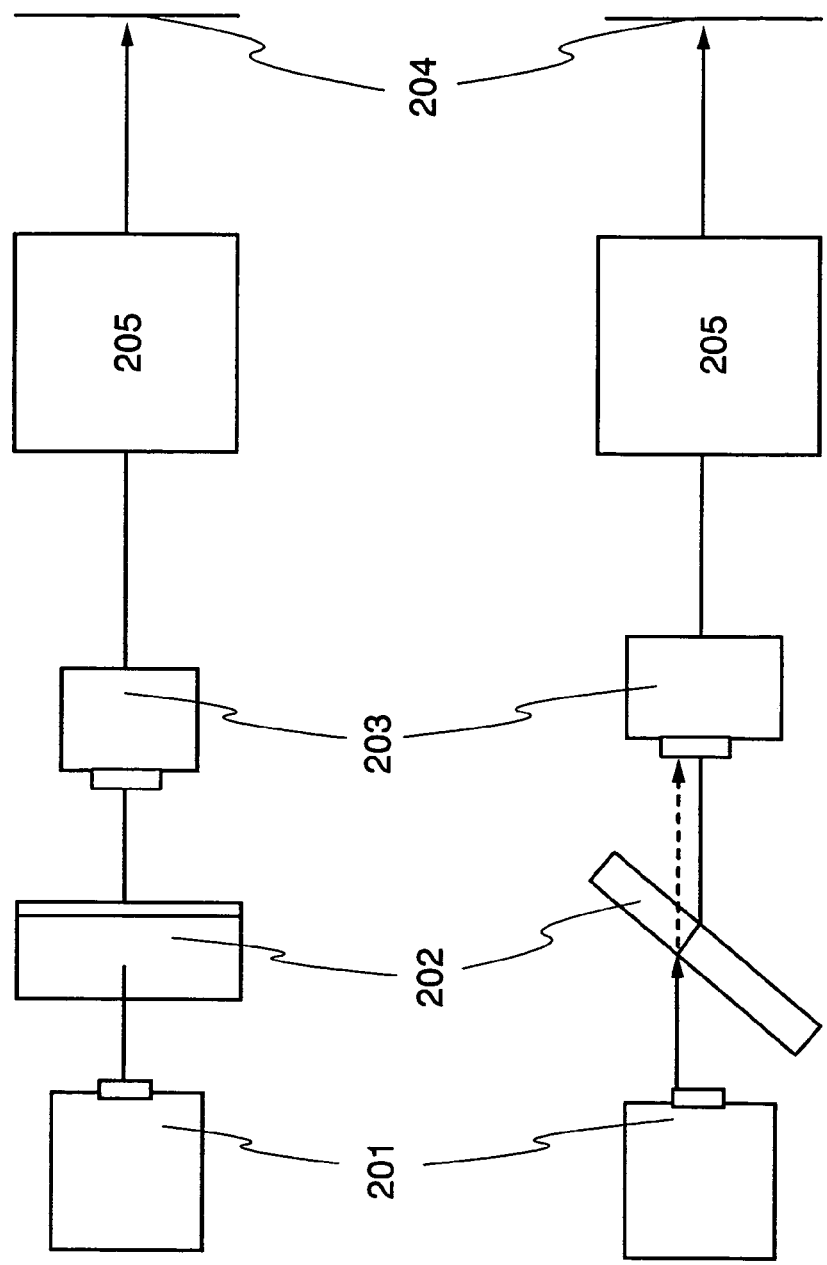

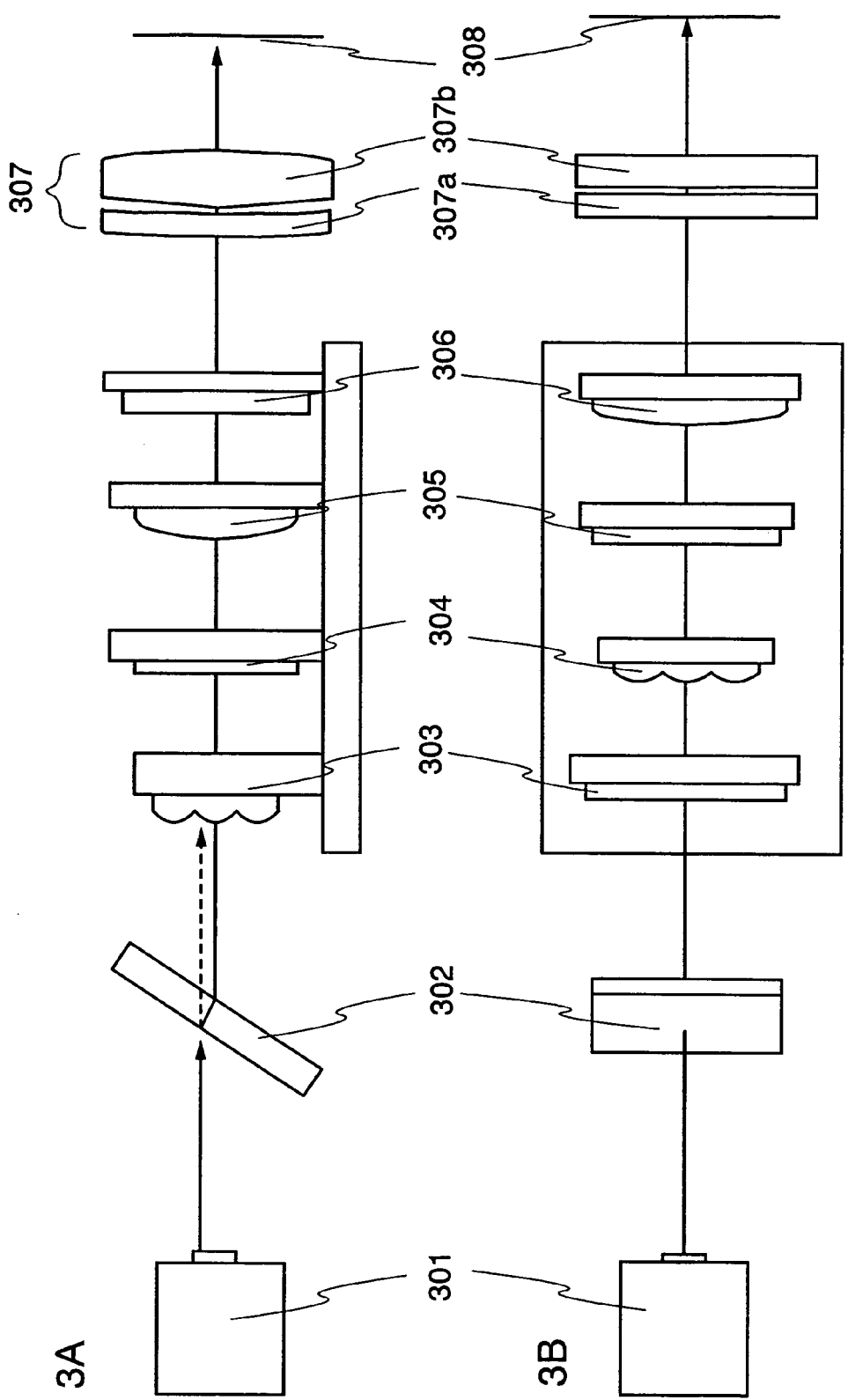

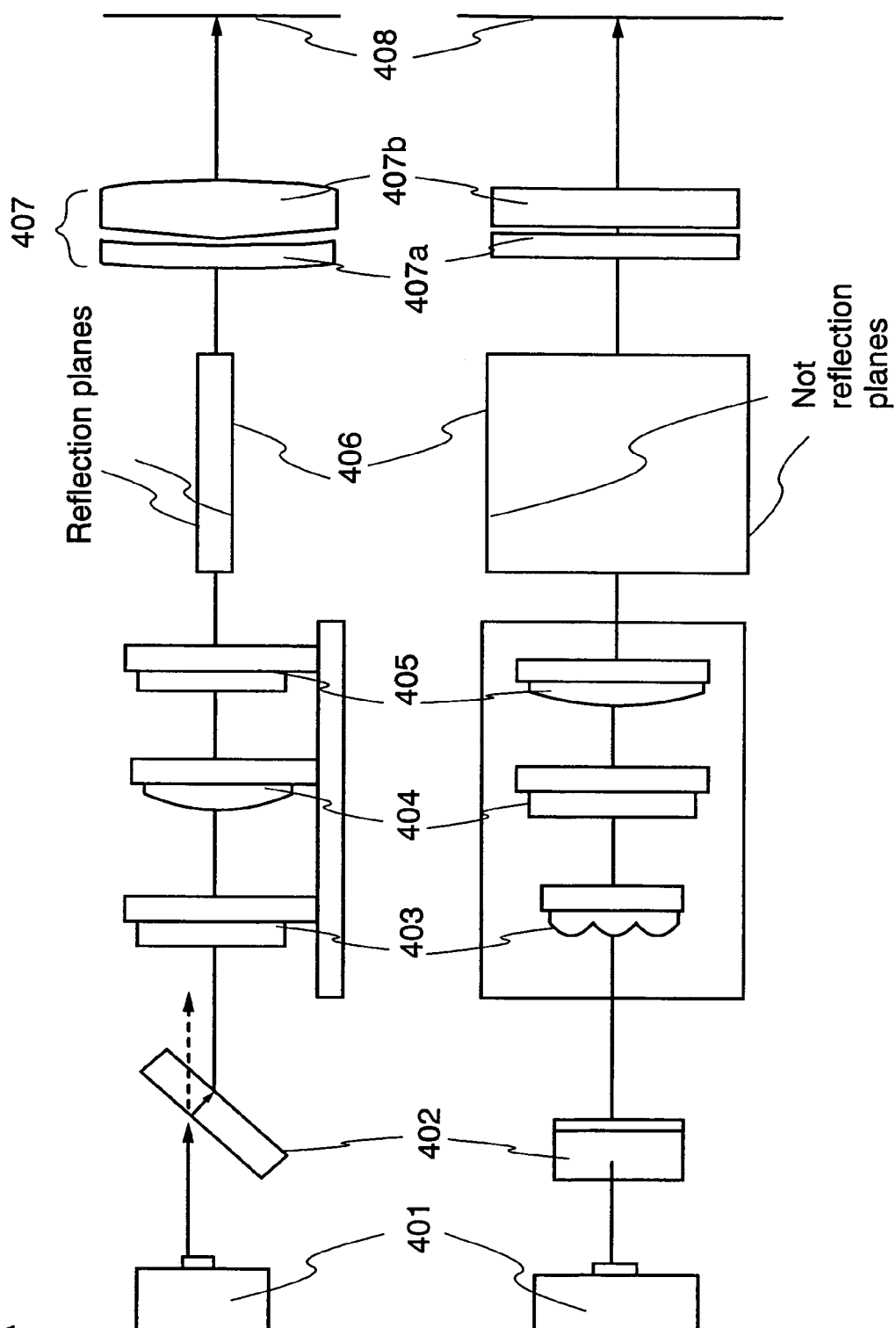

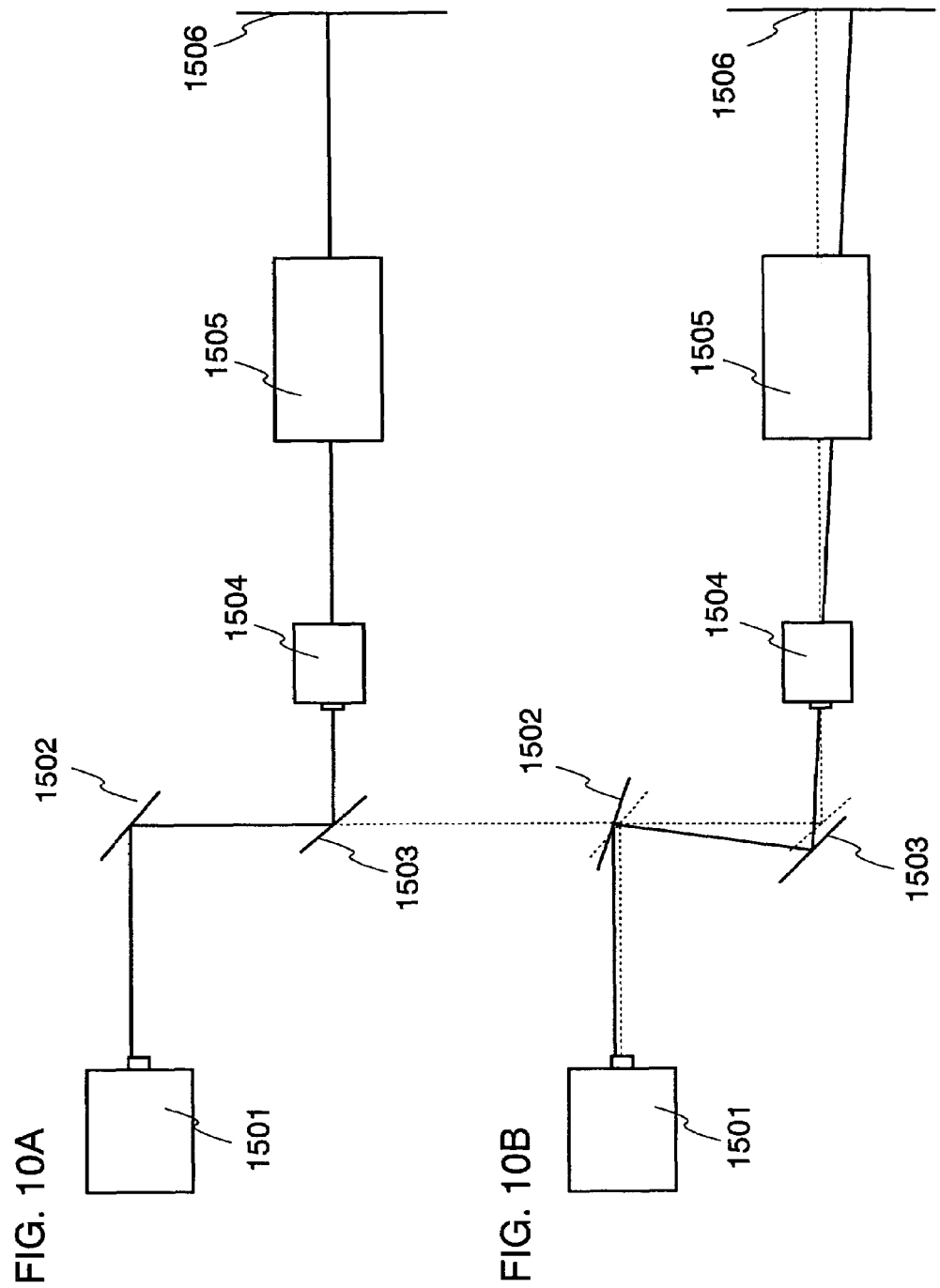

LASER IRRADIATION APPARATUS AND METHOD FOR MANUFACTURING SEMICONDUCTOR DEVICE

BACKGROUND OF THE INVENTION

1. Field of the Invention

The present invention relates to a laser irradiation apparatus and a method for manufacturing a semiconductor device by using the laser irradiation apparatus.

2. Related Art

In recent years, a technique to form a thin film transistor (hereinafter referred to as a TFT) over a substrate has made great progress, and application development to an active matrix display device has been advanced. Particularly, a TFT formed using a poly-crystalline semiconductor film is superior in field-effect mobility to a TFT formed using a conventional amorphous semiconductor film, and therefore high-speed operation becomes possible when the TFT is formed using the poly-crystalline semiconductor film. For this reason, a circuit for driving a pixel, which has been mounted by an external IC chip, can be formed integrally with the pixel over the same substrate by a TFT.

The poly-crystalline semiconductor film suitable for manufacturing a TFT is obtained by crystallizing an amorphous semiconductor film. To crystallize the amorphous semiconductor film, a laser annealing method is generally employed. The laser annealing is more preferable than a general thermal annealing that requires a temperature as high as 600° C. or more. This is because an inexpensive glass substrate, which is often employed as a substrate of a TFT, is inferior in heat resistance and is easy to change in shape due to heat. That is to say, the laser annealing has advantages that the processing time can be shortened to a large degree compared with another annealing method using radiation heat or conduction heat and that a semiconductor substrate or a semiconductor film over a substrate can be heated selectively and locally so that the substrate is hardly damaged thermally. Therefore, the laser annealing method is widely used to crystallize the amorphous semiconductor film formed over the glass substrate.

It is noted that the laser annealing method described herein includes the technique to recrystallize an amorphous layer or a damaged layer formed in the semiconductor substrate or the semiconductor film and the technique to crystallize an amorphous semiconductor film formed over a substrate. In addition, the technique to flatten or modify the surface of the semiconductor substrate or the semiconductor film is also included.

It is preferable to perform the laser annealing in such a way that a beam spot is shaped into a square having a length of several cm on a side or into a line having a length of 100 mm or more through an optical system and that the beam spot is moved relative to the irradiated surface (or a region irradiated by the laser beam is moved relative to in a surface of a processing object) because this method provides high productivity and is superior industrially. (For example, see Reference 1.) It is noted that the term of linear herein used does not mean a line in a strict sense but means a rectangle having a large aspect ratio (or an oblong). For example, the rectangle having an aspect ratio of 10 or more (preferable in the range of 100 to 10000) is referred to as the line. It is noted that the linear is still included in the rectangular.

(Reference 1) Japanese Patent Laid-Open No. H08-088196

Since the laser beam emitted from the laser oscillator generally has Gaussian intensity distribution in which the intensity of the laser beam is attenuated from the center toward the end portion, it is necessary to homogenize the intensity distribution of the laser beam on the irradiated surface in order to perform the homogeneous laser annealing. In recent years, in order to form a linear beam having a homogenous intensity distribution, a method is known in which a lens array is used to divide the laser beam in a predetermined direction and to combine the divided laser beams. However, in this method, adjustment of the optical system requires a large amount of time. Here, the optical adjustment has two modes; setting an optical system such as a lens and a mirror on a predetermined position to perform a laser annealing; and after maintenance of a laser oscillator, correcting a misalignment of a laser beam involved by a misalignment of a window to perform the laser annealing again. Hereinafter, the former and the latter are defined as "adjustment" and "readjustment", respectively. The latter, that is "readjustment", is explained as follows.

A linear beam generally used to perform the laser annealing to the semiconductor film has an extremely narrow width, which is 1 mm or less. In order to homogenize the intensity distribution of the linear beam having such a narrow width in a direction of its short side, it is necessary to superpose laser beams divided by the lens array with very high accuracy. When one of the optical elements is displaced even a little, the intensity distribution of the beam spot formed on the irradiated surface may vary. For this reason, very accurate readjustment of the optical system is required, which consumes a large amount of time. During the readjustment of the optical system, the laser irradiation apparatus cannot be used and the process using the laser irradiation apparatus stops. This causes the throughput to decrease.

The optical system is readjusted by various reasons. Particularly, the optical system is most frequently readjusted when the laser beam is displaced from the predetermined position due to the maintenance work inside the laser oscillator.

As one of the maintenance works causing the misalignment of the laser beam from the predetermined position, cleaning of a window in a gas laser oscillator is explained here. In this maintenance work, the window of the gas laser oscillator is removed once in order to clean and then the window is set again to the same place in the laser oscillator. In this case, it is difficult to set the window to the same place and the window may be displaced. As a result, the laser beam is displaced from the predetermined position. This misalignment of the laser beam is explained with reference to FIGS. 1A and 1B.

A laser oscillator 101a shown in FIG. 1A has a pair of resonator mirrors 102a and 106a, a pair of windows 103a and 105a, and O-rings 104a. A flat glass 107a is not rotated in any directions because the laser beam is in the predetermined position. The laser beam emitted from the laser oscillator 101a forms a beam spot having a homogenous intensity distribution on an irradiated surface 109a by transmitting through an optical system 108a.

On the other hand, FIG. 1B shows a laser irradiation apparatus in which an incident position of the laser beam into the optical system is different from that shown in FIG. 1A. In FIG. 1B, since the window 105b is not set to the predetermined position, the laser beam is displaced from the predetermined position. This is because the O-ring for fixing the window is made of rubber When the stress applied to the O-ring is not homogeneous, the O-ring is not pressed homogeneously. Since it is a man that sets the window to the laser oscillator, it is impossible to apply the completely homogeneous stress to the whole O-ring, and therefore the O-ring is not pressed homogeneously. As a result, as shown in FIG. 1B, the window is tilted from its original position where the window is set before being removed.

It is noted that FIG. 1B uses the same laser oscillator as that shown in FIG. 1A. The laser oscillator 101b has a pair of resonator mirrors 102b and 106b, a pair of windows 103b and 105b, and O-rings 104b. A flat glass 107b, an optical system 108b, and an irradiated surface 109b in FIG. 1B correspond to the flat glass 107a, the optical system 108a, and the irradiated surface 109a in FIG 1A.

The optical systems 108a and 108b are designed and positioned so that beam spots having a homogeneous intensity distribution are formed on the irradiated surfaces 109a and 109b respectively when the laser beam is in the predetermined position. Therefore, when the laser beam is displaced from the predetermined position, the laser beam is incident into a different position in the optical system, and the intensity distribution of the beam spot formed on the irradiated surface may not be homogeneous. As a result, the annealing may not be performed homogeneously to the irradiated object. When the laser annealing is performed using a semiconductor film as the irradiated surface in such a way that this beam spot is scanned relative to the semiconductor film and when TFTs are manufactured using a crystalline semiconductor film obtained thus, the electrical characteristic varies between the TFTs, and moreover the reliability may be lowered. In view of these problems, it is necessary to correct the misalignment of the laser beam from the predetermined position and to keep the incident position of the laser beam into the optical system the same in order to obtain the homogeneous intensity distribution on the irradiated surface and in order to perform homogeneous annealing to the irradiated object.

In order to correct the misalignment of the laser beam from the predetermined position, a steering mirror has been used conventionally. With reference to FIGS. 10A and 10B, a general example is explained in which the steering mirror is used to correct the misalignment of the laser beam. In FIG. 10A, the misalignment of the laser beam emitted from a laser oscillator 1501 is corrected by moving the laser beam parallel using two steering mirrors.

To correct the misalignment of the laser beam, it is effective to readjust the position of the laser beam by steering mirrors 1502 and 1503 while confirming the predetermined position of the laser beam with the use of a CCD camera 1504. It is noted that since the CCD camera 1504 is used only to correct the misalignment, it is set so that it can be easily removed after correcting the misalignment. An optical system 1505 has a structure for homogenizing the intensity distribution of the laser beam and for shaping the laser beam into a linear beam on an irradiated surface 1506.

However, the method using the steering mirror has the following problem. The steering mirror can only control the position of the laser beam but also change a traveling direction thereof Therefore, when the laser beam propagates from the steering mirror 1502 to the steering mirror 1503, the traveling direction thereof may change. In FIG. 10A, the misalignment of the laser beam from the predetermined position is corrected by the steering mirrors 1502 and 1503. On the other hand, in FIG 10B, the traveling direction of the laser beam changes by the steering mirrors 1502 and 1503. In order to clarify this change of the traveling direction, the traveling direction of the laser beam in FIG. 10A is shown by a dotted line in FIG. 10B.

When the laser beam whose travel direction changes is incident into the optical system, the intensity distribution of the linear beam spot formed on the irradiated surface 1506 may vary. Even though the CCD camera 1504 is used, the change of the traveling direction of the laser beam cannot be detected.

Although the position of the laser beam observed by the CCD camera 1504 is the same in FIGS. 10A and 10B, it is understood that its traveling direction is different. Thus, the conventional technique in which two steering mirrors are used to correct the misalignment of the laser beam from the predetermined position has a problem to be solved.

Although the misalignment of the laser beam from the predetermined position can be corrected by readjusting the optical system, this method is not preferable because the readjustment requires high accuracy and consumes a large amount of time as described above.

SUMMARY OF THE INVENTION

In view of the above problem, it is an object of the present invention to provide a laser irradiation apparatus that can readjust the optical system more easily and more accurately than the conventional technique in which the steering mirror is used and that can shorten the time for readjusting the optical system to a large degree. Moreover, it is also an object of the present invention to provide a method for manufacturing a semiconductor device using the laser irradiation apparatus.

The present invention discloses a laser irradiation apparatus including a laser oscillator, a first optical system, and a second optical system, wherein the first optical system keeps a laser beam emitted from the laser oscillator in a predetermined position by correcting a misalignment of the laser beam in such a way that the laser beam is moved parallel before and after the first optical system, and wherein the second optical system homogenizes an intensity distribution of the laser beam on an irradiated surface.

It is preferable that the first optical system consists of one optical element.

When the first optical system consists of one optical element, it is easy to correct the misalignment of the laser beam compared with the case using a plurality of steering mirrors. Moreover, since the first optical system does not control the traveling direction of the laser beam, the misalignment of the laser beam can be corrected by moving the laser beam parallel without affecting the traveling direction of the laser beam. The second optical system is a beam homogenizer for homogenizing the intensity distribution of the laser beam on the irradiated surface. The beam homogenizer may be designed appropriately by a person who practices in accordance with the condition such as the desired beam shape, the desired size, or the irradiated object.

When the misalignment of the laser beam from a predetermined position is corrected by the present invention, it is more preferable to know the predetermined position of the laser beam in advance in order to facilitate the correction. Consequently, the present invention discloses a laser irradiation apparatus including a laser oscillator, a first optical system, position detecting means having a recording function, and a second optical system, wherein the position detecting means records a predetermined position of a laser beam emitted from the laser oscillator, wherein the position detecting means detects a misalignment of the laser beam from the predetermined position, wherein the first optical system keeps the laser beam in the predetermined position by correcting the misalignment of the laser beam in such a way that the laser beam is moved parallel before and after the first optical system, wherein the second optical system homogenizes an intensity distribution of the laser beam on an irradiated surface, and wherein the first optical system has one optical element.

In the above structure, the laser beam is moved parallel by rotating the first optical system on a straight line perpendicular to a traveling direction of the laser beam.

In the above structure, the laser beam is moved parallel by rotating the first optical system on a straight line parallel to the traveling direction of the laser beam.

In the above structure, the first optical system is provided between the laser oscillator and the second optical system.

In the above structure, the position detecting means has a CCD camera.

By correcting the misalignment of the laser beam from the predetermined position as thus described, an incident position of the laser beam into the second optical system can be kept the same. Therefore, not depending on the misalignment of the laser beam when being emitted from the laser oscillator, the second optical system can always form a beam spot having a homogenous intensity distribution on the irradiated surface.

In the above structure, the laser oscillator is a CW or pulsed gas laser. The present invention can be applied to all the gas lasers that have a window inside and that can displace the laser beam after the maintenance of the window. As the gas laser, a CW or pulsed excimer laser, Ar laser, Kr laser, or the like is given.

In the laser irradiation apparatus of the present invention, a light-transmitting parallel flat plate is used as the first optical system.

In the laser irradiation apparatus of the present invention, a flat glass is used as the first optical system.

The present invention discloses a method for manufacturing a semiconductor device including the steps of forming a non-single crystal semiconductor film over a substrate and performing laser annealing to the non-single crystal semiconductor film as an irradiated surface. The laser annealing step further includes the steps of moving a laser beam emitted from a laser oscillator parallel by a first optical system has one optical element and homogenizing an intensity distribution of the laser beam moved thus on the irradiated surface by a second optical system, wherein a misalignment of the laser beam from a predetermined position is corrected in such a way that the first optical system rotates on a straight line perpendicular to a traveling direction of the laser beam.

The present invention discloses a method for manufacturing a semiconductor device including the steps of forming a non-single crystal semiconductor film over a substrate and performing laser annealing to the non-single crystal semiconductor film as an irradiated surface. The laser annealing step further includes the steps of recording a predetermined position of a laser beam emitted from a laser oscillator, detecting a misalignment of the laser beam from the predetermined position, keeping the laser beam in the predetermined position by moving the laser beam parallel using a first optical system consisting of one optical element, and homogenizing an intensity distribution of the laser beam moved thus on the irradiated surface using a second optical system, wherein the misalignment of the laser beam from the predetermined position is corrected in such a way that the first optical system rotates on a straight line perpendicular to a traveling direction of the laser beam.

In the method for manufacturing the semiconductor device of the present invention, the misalignment of the laser beam from the predetermined position is corrected in such a way that the first optical system rotates on a straight line parallel to a traveling direction of the laser beam.

In the method for manufacturing the semiconductor device of the present invention, the first optical system is provided between the laser oscillator and the second optical system.

In the method for manufacturing the semiconductor device of the present invention, a CCD camera is used in order to record the predetermined position of the laser beam and to detect the misalignment of the laser beam from the predetermined position.

In the method for manufacturing the semiconductor device of the present invention, the laser oscillator is a CW or pulsed gas laser.

In the method for manufacturing the semiconductor device of the present invention, the first optical system is a light-transmitting parallel flat plate.

In the method for manufacturing the semiconductor device of the present invention, the first optical system is a flat glass.

In the method for manufacturing the semiconductor device of the present invention, the misalignment of the laser beam from the predetermined position is corrected in such a way that the light-transmitting parallel flat plate rotates on a straight line parallel to the traveling direction of the laser beam.

In the method for manufacturing the semiconductor device of the present invention, the light-transmitting parallel flat plate is provided between the laser oscillator and the optical system for homogenizing the intensity distribution of the laser beam on the irradiated surface.

In the method for manufacturing the semiconductor device of the present invention, the laser oscillator is a CW or pulsed gas laser.

Conventionally, when the laser beam is displaced from the predetermined position, the misalignment is corrected by readjusting the optical system including a plurality of steering mirrors. Such a conventional method requires much time until the apparatus can be used again. According to the present invention, however, only one optical element is readjusted to correct the misalignment of the laser beam from the predetermined position. Therefore, it is possible to shorten the time for readjusting the optical system. Moreover, unlike the steering mirror, the present invention does not affect the traveling direction, and therefore the misalignment of the laser beam can be corrected easily without considering the change of the traveling direction.

As thus described, since the misalignment of the laser beam from the predetermined position can be corrected easily in short time by the present invention, the laser irradiation apparatus can be used again in short time after the maintenance work inside the laser oscillator. Therefore, the present invention can avoid waste of time and can increase the throughput.

BRIEF DESCRIPTION OF THE DRAWINGS

In the accompanying drawings:

FIGS. 1A and 1B are drawings for showing an embodiment mode 1;

FIGS. 2A and 2B are drawings for showing an embodiment mode 2;

FIGS. 3A and 3B are drawings for showing an embodiment 1;

FIGS. 4A and 4B are drawings for showing an embodiment 2;

FIGS. 10A and 10B are drawings for showing the conventional technique.

DETAILED DESCRIPTION OF THE INVENTION

Embodiment Mode 1

Figure 5:
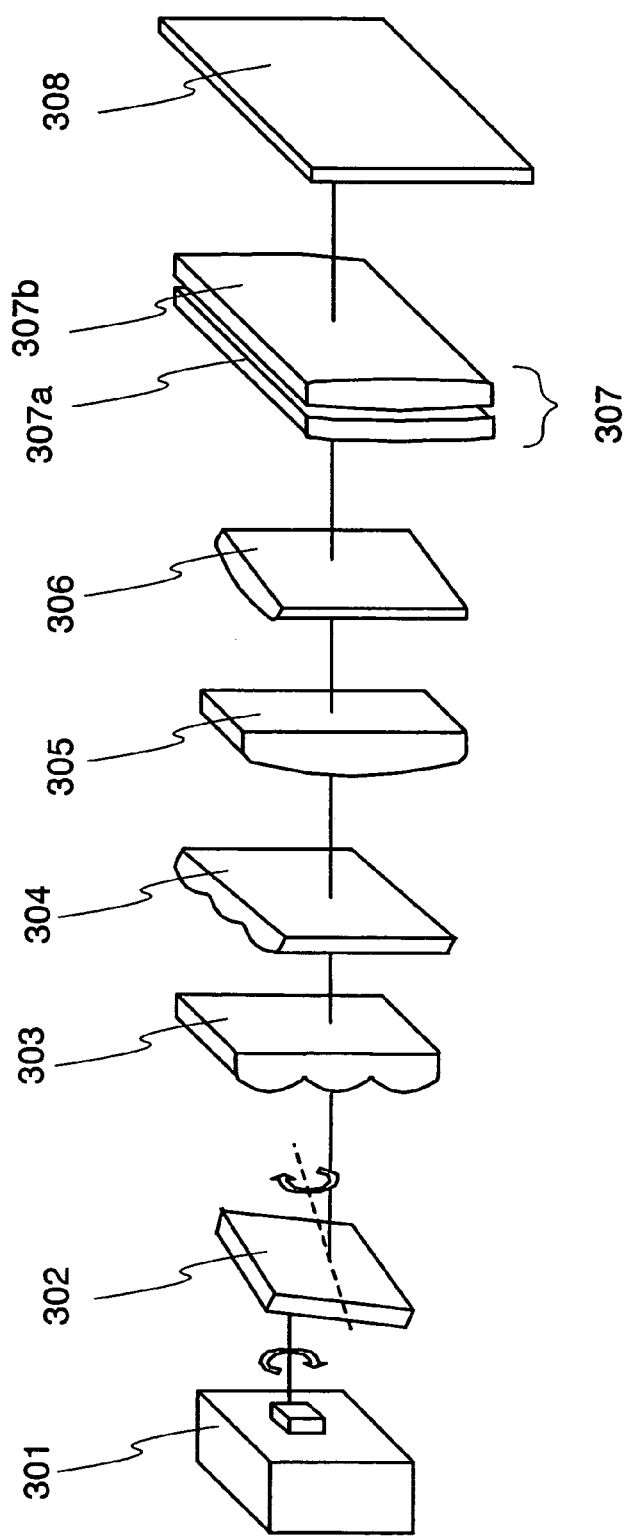
FIG. 5 is a drawing for showing an embodiment 1.

An embodiment mode of the present invention is explained with reference to FIGS. 1A and 1B. FIGS. 1A and 1B show an example in which the misalignment of the laser beam from the predetermined position is corrected using a flat glass. Both figures show schematically an internal structure of an excimer laser, which is one kind of gas laser. The gas laser typified by the excimer laser has a window, a mirror, and the like inside, and it is necessary to perform the maintenance work such as cleaning of these parts regularly. This embodiment mode explains an example in which a flat glass is used to correct a misalignment of the laser beam from a predetermined position that is caused by the maintenance work in which the parts are removed for the cleaning and then the parts are set again.

In FIGS. 1A and 1B, the laser irradiation apparatus has the same laser oscillator and the same optical system by which a beam spot having a homogeneous intensity distribution is formed on an irradiated surface. In FIG. 1A, a laser beam emitted from a laser oscillator 101a is incident into a predetermined position in an optical system 108a at a predetermined angle. The optical system 108a is designed so that the beam spot having a homogeneous intensity distribution is formed on an irradiated surface 109a only when the laser beam is incident into the predetermined position in the optical system at the predetermined angle. Therefore, it is necessary to keep the incident position and the incidence angle of the laser beam into the optical system that is shown in FIG. 1A in order to form the beam spot having a homogeneous intensity distribution on the irradiated surface 109a. On this occasion, a flat glass 107a is not rotated in any directions and does not affect the position of the laser beam.

On the other hand, FIG. 1B shows an example in which the incident position of the laser beam into the optical system is displaced from the predetermined position. This misalignment is caused when the window is displaced from its original position due to the dissymmetric shape of the O-ring. When the laser beam is incident into the optical system without correcting the misalignment, the intensity distribution of the laser beam formed on the irradiated surface varies, and it is difficult to perform the homogeneous annealing. Consequently, a flat glass is provided between the laser oscillator and the optical system in the present embodiment mode. When the flat glass is rotated on a straight line perpendicular to the traveling direction of the laser beam or, in addition to that, when the flat glass is rotated on a straight line parallel to the traveling direction of the laser beam in accordance with the misalignment of the laser beam, the laser beam can be moved parallel to correct the misalignment. The rotation of the flat glass may be controlled according to the misalignment of the laser beam from the predetermined position appropriately by a person who practices.

It is noted that the present invention can be applied not only to the excimer laser but also to another gas laser that includes a window inside the oscillator. And such a gas laser has a possibility to displace the laser beam from the predetermined position by the maintenance work such as cleaning of the window. As the gas laser, a CW or pulsed excimer laser, Ar laser, Kr laser, or the like is given.

Thus, even though the laser beam is displaced from the predetermined position, the misalignment can be corrected easily and the position of the laser beam can be kept the same. Moreover, since the incident position of the laser beam into the optical system can be kept the same, the beam spot having a homogeneous intensity distribution can be formed on the irradiated surface. For example, when the laser annealing is performed to the semiconductor film, it is possible to crystallize the semiconductor film homogeneously, to activate the impurity homogeneously, and so on. Moreover, the crystalline semiconductor film obtained thus can be used to manufacture an active matrix display for example. The active matrix display can be manufactured by a person who practices according to a known method.

Embodiment Mode 2

The present embodiment mode explains with reference to FIGS. 2A and 2B an example in which a CCD camera is used in addition to the flat glass explained in the embodiment mode 1. The CCD camera records a predetermined position of a laser beam before the laser beam is displaced from the predetermined position. After the laser beam is displaced, the misalignment is detected by using the CCD camera again.

In FIGS. 2A and 2B, the laser irradiation apparatus has an optical system 205 for forming a rectangular beam spot having a homogeneous intensity distribution on an irradiated surface 204. A beam spot having a rectangular shape on the irradiated surface is hereinafter referred to as a rectangular beam. This optical system 205 may be designed appropriately by a practitioner in accordance with the size, shape, and the like of the beam spot that the practitioner desires to form on the irradiated surface.

An excimer laser is used as a laser oscillator 201 as well as in the embodiment mode 1. In order to correct the misalignment of the laser beam from the predetermined position, a flat glass 202 and a CCD camera 203 are provided according to the present invention. The flat glass 202 is positioned between the laser oscillator 201 and the optical system 205. However, the position of the CCD camera 203 is not limited to this and it may be provided in the optical system.

Initially, when the laser beam emitted from the laser oscillator 201 forms a rectangular beam having a homogeneous intensity distribution on the irradiated surface 204 through the optical system, a position of the laser beam is recorded using the CCD camera 203. When the laser beam is displaced after the maintenance of the laser oscillator, the flat glass 202 is used to correct the misalignment. The misalignment is corrected in such a way that the CCD camera 203 is used again to detect the amount and the direction of misalignment of the laser beam based on the image obtained by the CCD camera 203 before the maintenance and that the flat glass 202 is rotated on a straight line perpendicular to the traveling direction of the laser beam or, in addition to that, the flat glass 202 is rotated on a straight line parallel to the traveling direction of the laser beam.

Thus, it is possible to readjust the position of the laser beam in short time by adjusting only the flat glass without readjusting each optical element and therefore to obtain a beam spot having a homogeneous intensity distribution on the irradiated surface in short time.

When the laser annealing is performed to the semiconductor film using the laser beam obtained thus, it is possible to crystallize the semiconductor film homogeneously, to activate the impurity homogeneously, and so on. Moreover, the crystalline semiconductor film can be used to manufacture an active matrix display for example. The active matrix display can be manufactured by a practitioner according to a known method.

Embodiment 1

This embodiment explains an example of the laser irradiation and shows the specific optical system with reference to FIGS. 3A and 3B. In FIGS. 3A and 3B, an excimer laser is used as a laser oscillator 301. The optical system has cylindrical lens arrays 303 and 304, convex cylindrical lenses 305 and 306, and a doublet cylindrical lens 307 consisting of cylindrical lenses 307a and 307b. This optical system is used to form a laser beam having a rectangular shape on an irradiated surface 308. Hereinafter this laser beam is referred to as a rectangular beam. It is noted that a direction of a long side of the rectangular beam formed on the irradiated surface 308 is perpendicular to the paper in FIG. 3A.

In FIG. 3A, the laser beam incident into the cylindrical lens array 303 is divided in a direction of a short side of the rectangular beam, and the divided beams are combined by the convex cylindrical lens 305. Thus, the intensity distribution is homogenized in the direction of the short side of the rectangular beam. Moreover, the doublet cylindrical lens 307 condenses the laser beam and determines the length of the rectangular beam in the direction of its short side. On the other hand, in FIG. 3B, the laser beam incident into the cylindrical lens array 304 is divided in the direction of the long side of the rectangular beam, and the divided beams are combined by the convex cylindrical lens 306. Thus, the intensity distribution of the rectangular beam is homogenized in the direction of its long side. The length of the long side of the rectangular beam is determined by the convex cylindrical lens 306. Thus, the rectangular beam having a homogeneous intensity distribution and having the desired size can be formed on the irradiated surface 308.

According to the present invention, the flat glass 302 is set between the laser oscillator 301 and the optical system as indicated in FIGS. 3A and 3B. The optical elements 303 to 306 are mounted on a rail in this embodiment. With this structure, the optical elements 303 to 306 can be removed at the same time by removing the rail, and then the CCD camera (not illustrated in the figure) can be set in the position where the rail was provided. Moreover, the optical elements can be removed easily while the optical elements keep the same position and the same distance therebetween. It is noted that the position of the CCD camera is not limited to this and it may be provided between the laser oscillator and the optical system.

When the laser beam has a homogeneous intensity distribution on the irradiated surface 308, the position of the laser beam is recorded by the CCD camera. Then, after a window is removed from the laser oscillator and cleaned, it is set to the laser oscillator again. On this occasion, since it is difficult to set the window to its original position, the laser beam emitted from the laser oscillator may be displaced. Consequently, the flat glass 302 is used to correct the misalignment. The flat glass 302 can rotate on a straight line perpendicular to the traveling direction of the laser beam emitted from the laser oscillator 301 as shown in FIGS. 3A and 3B. Moreover, the flat glass 302 can also rotate on a straight line parallel to the traveling direction of the laser beam emitted from the laser oscillator 301 as shown in FIG. 5, which shows the structure three dimensionally. Then, the CCD camera (not illustrated in the figure) is used again to confirm the amount and the direction of misalignment from the predetermined position. Subsequently, the misalignment of the laser beam is corrected by rotating the flat glass 302 on the straight line perpendicular to the traveling direction of the laser beam emitted from the laser oscillator 301 or, in addition to that, by rotating the flat glass 302 on a straight line parallel to the traveling direction of the laser beam. After correcting the misalignment, the CCD camera is removed, and the rail on which the optical elements 303 to 306 are mounted is returned to the original place. Then, the laser beam is made incident into the optical system. Thus, the incident position of the laser beam into the optical system can be made the same as before the laser beam is displaced, and therefore the rectangular beam having a homogeneous intensity distribution, which is the same as that obtained before removing the window, can be obtained on the irradiated surface 308.

When the laser annealing is performed to the semiconductor film using the laser beam obtained thus, it is possible to crystallize the semiconductor film homogeneously, to activate the impurity homogeneously, and so on. Moreover, the crystalline semiconductor film can be used to manufacture an active matrix display.

Embodiment 2

This embodiment explains an example with reference to FIGS. 4A and 4B in which a rectangular beam is formed using a different optical system from that explained in the embodiment 1. A laser oscillator 401 is an excimer laser. The optical system has a cylindrical lens array 403, convex cylindrical lenses 404 and 405, an optical waveguide 406, and a doublet cylindrical lens 407 consisting of cylindrical lenses 407a and 407b. As well as in the embodiment 1, the optical elements 403 to 405 are fixed to a rail so that they can be removed while keeping its position and the distance therebetween as shown in FIGS. 4A and 4B. The flat glass 402 is provided between the laser oscillator 401 and the optical system. The flat glass 402 is the same as that in the embodiment 1. The optical waveguide 406 has a pair of reflection planes provided oppositely, and the pair of reflection planes is provided so as to act on the direction of the short side of the rectangular beam formed on the irradiated surface 408. The space between the pair of reflection planes is filled with air. In FIG. 4A, the direction of the long side of the rectangular beam formed on the irradiated surface 408 is perpendicular to the paper.

In FIG. 4A, the laser beam emitted from the laser oscillator is condensed by the convex cylindrical lens 404 and incident into the optical waveguide 406. The laser beam is reflected in the optical waveguide 406 repeatedly and is led to the exit. The intensity distribution of the rectangular beam is homogenized in the direction of its short side at the exit of the optical waveguide 406. After that, the length of the rectangular beam in the direction of its short side is determined by the doublet cylindrical lens 407, and the rectangular beam is irradiated to the irradiated surface 408. On the other hand, in FIG. 4B, the laser beam incident into the cylindrical lens array 403 is divided in the direction of the long side of the rectangular beam, and the divided beams are combined by the convex cylindrical lens 405. Thus, the intensity distribution of the rectangular beam in the direction of its long side is homogenized and the length thereof in the direction of its long side is determined. The rectangular beam having the homogeneous intensity distribution and having the desired size is thus formed on the irradiated surface 408.

Figure 6:
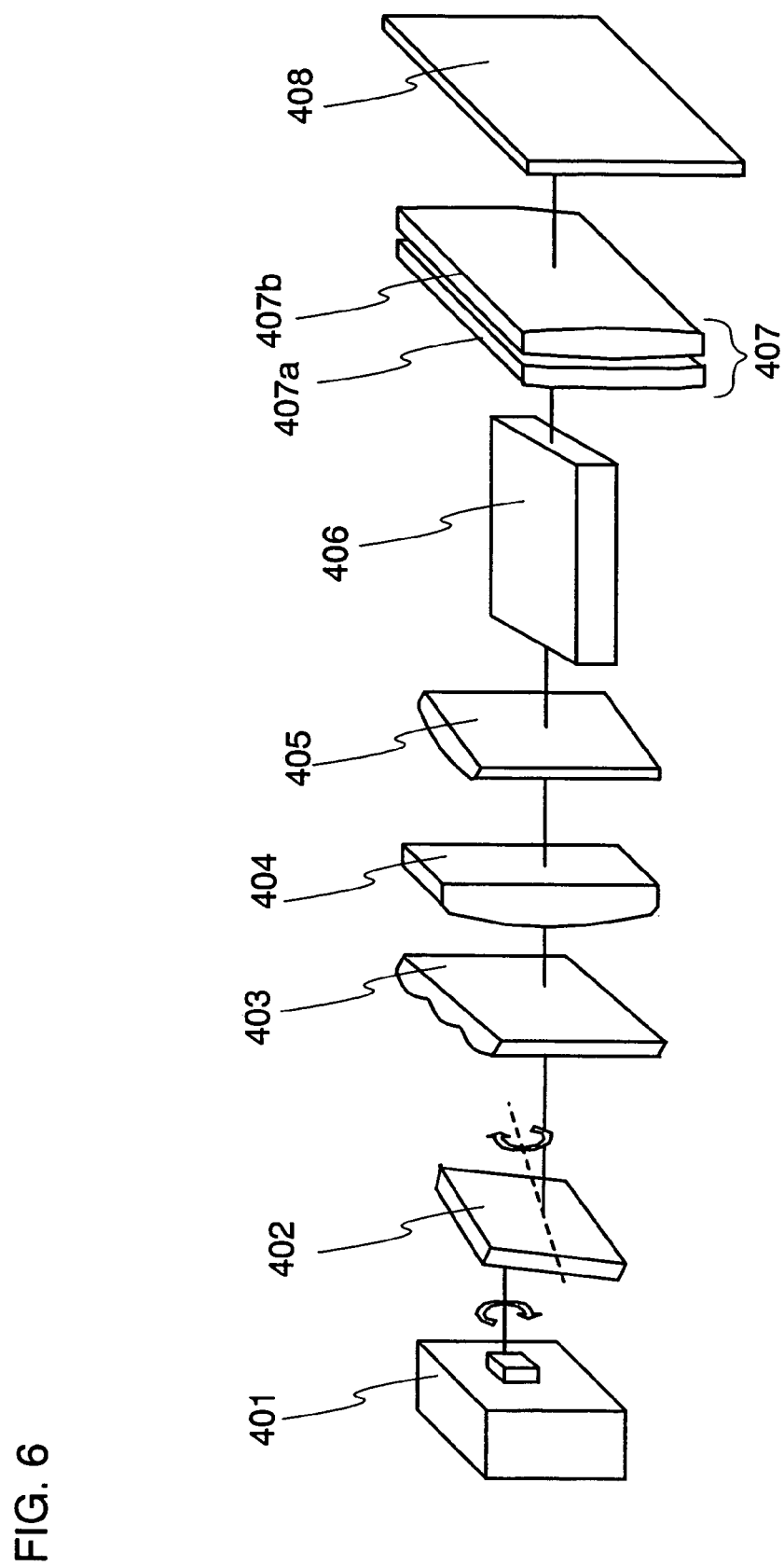
FIG. 6 is a drawing for showing an embodiment 2.

In this laser irradiation apparatus, a flat glass 402 and a CCD camera (not illustrated in the figure) are used to readjust the position of the laser beam when the laser beam emitted from the laser oscillator is displaced. The CCD camera is provided after removing the rail on which the optical elements 403 to 405 are mounted. The CCD camera and the flat glass 402 are used to correct the misalignment of the laser beam from the predetermined position as well as the embodiment 1 and to keep the incident position and the incidence angle of the laser beam into the optical system the same. In FIGS. 4A and 4B, the flat glass 402 rotates on the straight line perpendicular to the traveling direction of the laser beam. Moreover, FIG. 6 shows an example showing three dimensionally the flat glass 402 that rotates on the straight lines one of which is perpendicular and the other of which is parallel to the traveling direction of the laser beam. According to the present invention, the beam spot having a homogeneous intensity distribution can be formed on the irradiated surface regardless of the misalignment of the laser beam from the predetermined position.

When the laser annealing is performed to the semiconductor film using the laser beam obtained thus, it is possible to crystallize the semiconductor film homogeneously, to activate the impurity homogeneously, and so on. Moreover, the crystalline semiconductor film can be used to manufacture an active matrix display.

Embodiment 3

This embodiment explains a manufacturing process for forming a thin film transistor using the laser irradiation apparatus with reference to FIGS. 7A to 9E.

Figure 7A:
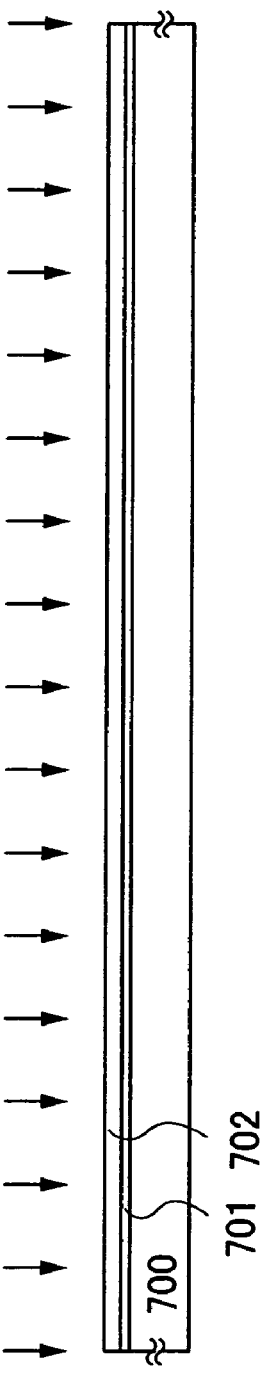
FIGS. 7A to 7C are cross-sectional views for showing a manufacturing process of a thin film transistor.
Figure 7B:
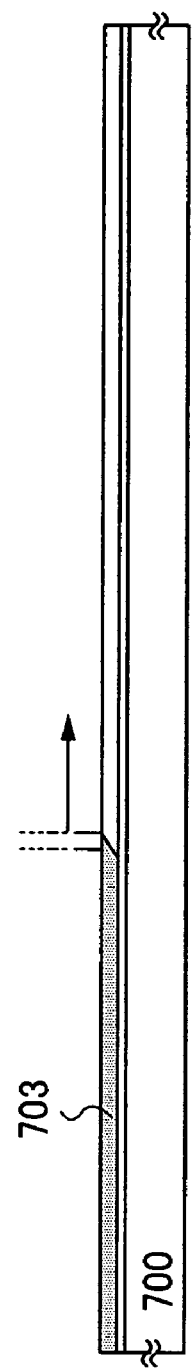
Figure 7C:
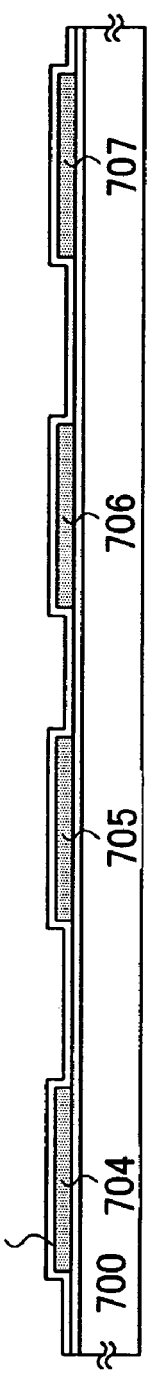

Initially, a base film 701 is formed over a substrate 700 as shown in FIG. 7A. A glass substrate such as a barium borosilicate glass or an alumino borosilicate glass, a quartz substrate, an SUS substrate, or the like can be used as the substrate 700 for example. In addition, although a substrate made of flexible synthetic resin such as plastic tends to be inferior to the above substrates in point of the resistance against the heat, the substrate made of flexible synthetic resin may be used when it can resist the heat in the manufacturing process.

The base film 701 is provided in order to prevent an alkali-earth metal or alkali metal such as Na included in the substrate 700 from diffusing into the semiconductor film and from causing an adverse effect on the characteristic of the semiconductor element. Therefore, the base film is formed of an insulating material such as silicon oxide, silicon nitride, or silicon nitride oxide, which can suppress the diffusion of the alkali-earth metal and alkali metal into the semiconductor film. In the present embodiment, a silicon nitride oxide film is formed in thickness from 10 to 400 nm by a plasma CVD method.

It is noted that the base film 701 may be formed of a single insulating film or may be formed by laminating a plurality of insulating films. In the case of using the substrate including the alkali metal or the alkali-earth metal in any way such as the glass substrate, the SUS substrate, or the plastic substrate, it is effective to provide the base film in terms of preventing the diffusion of the impurity. When the diffusion of the impurity does not lead to any significant problems, for example when the quartz substrate is used, the base film is not always necessary to be provided.

Next, an amorphous semiconductor film 702 is formed over the base film in thickness from 25 to 100 nm (preferably from 30 to 60 nm). Silicon or silicon germanium is used as the amorphous semiconductor film 702. After that, a heat treatment is performed at a temperature of 500° C. for one hour to dehydrogenate the amorphous semiconductor film 702.

Next, a crystalline semiconductor film 703 is formed by crystallizing the amorphous semiconductor film 702 using the laser irradiation apparatus of the present invention. Although an excimer laser is used in the laser crystallization process of this embodiment, other gas laser such as an Ar laser or a Kr laser can also be used. After the laser beam emitted from the excimer laser is shaped into rectangular using the optical system, the semiconductor film is irradiated with the rectangular beam spot. Specifically, the optical system are used to form a rectangular beam spot whose long side has the length from 100 to 1000 mm and short side has the length from 200 to 5000 µm and irradiated. In this embodiment, the beam spot is transformed into a linear beam spot whose long side has a length of 300 mm and short side has a length of 400 µm. On this occasion, the overlapping ratio of the linear beam is determined in the range of 50 to 98%, and it is 90% in this embodiment. In addition, the energy density of the laser beam is set in the range of 100 to 1000 mJ/cm$^2$, and it is set to 350 mJ/cm$^2$ using an attenuator in this embodiment. The pulse repetition rate (the number of the pulse oscillations per one second) is set in the range of 10 to 1000 Hz, and it is set to 300 Hz in this embodiment. After heating the substrate in the atmosphere of nitrogen at a temperature of 500° C. for one hour, the laser annealing is performed to crystallize the semiconductor film in this embodiment. Thus, a crystalline semiconductor film is formed. It is desirable to irradiate the semiconductor film with the laser beam while moving the stage at the speed from approximately 1 to 500 mm/s, and it is set to 12 mm/s in this embodiment. In the laser crystallization, since the misalignment of the laser beam from the predetermined position due to the maintenance of the laser oscillator can be corrected easily in short time by the present invention, homogeneous annealing can be performed stably.

The crystalline semiconductor film obtained thus is patterned into a desired shape, and semiconductor layers 704 to 707 are formed. After that, a gate insulating film 708 covering the semiconductor layers 704 to 707 is formed. The gate insulating film 708 is formed of an insulating film including silicon in thickness from 30 to 200 run by a sputtering method.

Figure 8A:
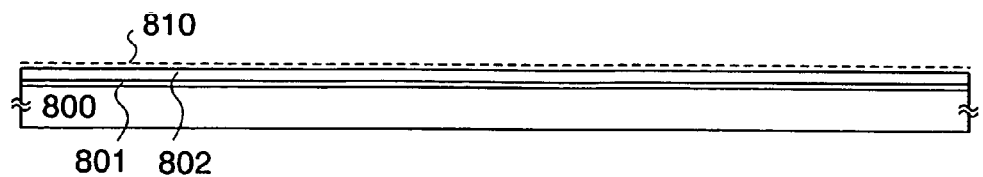
FIGS. 8A to 8D are cross-sectional views for showing a manufacturing process of a thin film transistor.

Subsequently, a method for forming the crystalline semiconductor film that is different from the above method is explained with reference to FIGS. 8A to 8D. In this case, a base film 801 is formed over a substrate 800 according to the same process as that shown in FIG. 7A. As the substrate 800, a glass substrate such as a barium borosilicate glass or an aluminoborosilicate glass, a quartz substrate, an SUS substrate, or the like can be used. Then, an amorphous semiconductor film 802 is formed over the base film 801 (FIG. 8A).

In this method, a nickel acetate solution 810 including Ni in the range of 1 to 100 ppm in weight is applied to the surface of the amorphous semiconductor film 802 by a spin coating method. It is noted that the catalyst may be added not only by the above method but also by another method such as a sputtering method, a vapor deposition method, or a plasma process.

Next, a heat treatment is performed at temperatures ranging from 500 to 650° C. for 4 to 24 hours, for example at a temperature of 550° C. for 14 hours. This heat treatment forms a crystalline semiconductor in which the crystallization is promoted vertically from the surface with the nickel acetate solution 810 applied thereon toward the substrate 800. Although nickel is used as the catalyst element in the present embodiment, the present invention is not limited this, and another element such as germanium (Ge), iron (Fe), palladium (Pd), tin (Sn), lead (Pb), cobalt (Co), platinum (Pt), copper (Cu), or gold (Au) may be used.

Figure 8B:
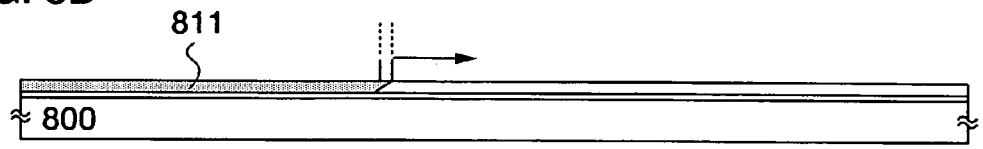

Next, as explained above, the laser beam is emitted from the excimer laser to irradiate the crystalline semiconductor and to form a crystalline semiconductor film 811 (FIG. 8B). By applying the present invention, it is possible to correct the misalignment of the laser beam from the predetermined position due to the maintenance of the laser oscillator, and to perform stable annealing using a laser having a homogeneous intensity distribution.

It is considered that the crystalline semiconductor film 811 formed thus includes the catalyst element (herein Ni) at a density of approximately $1 \times 10^{19}$ atoms/cm$^3$. Consequently, the gettering of the catalyst element existing in the crystalline semiconductor film 811 is performed next.

Figure 8C:
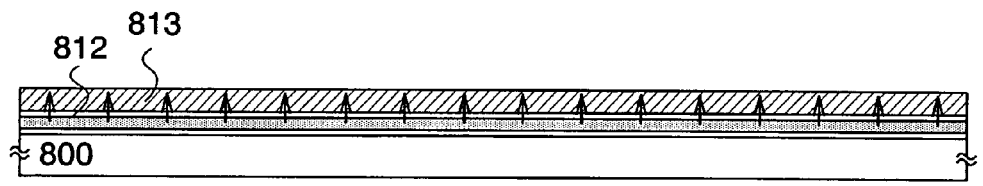

First, as shown in FIG. 8C, an oxide film 812 is formed on the crystalline semiconductor film 811. By forming the oxide film 812 in thickness from approximately 1 to 10 nm, it is possible to prevent the surface of the crystalline semiconductor film 811 from becoming rough in the following etching process.

The oxide film 812 can be formed by a known method. For example, the oxide film 812 may be formed by oxidizing the surface of the crystalline semiconductor film 811 using ozone water or using a solution in which a hydrogen peroxide solution is mixed with sulfuric acid, hydrochloric acid, nitric acid, or the like. Moreover, the oxide film 812 may be formed by a plasma process, a heat treatment, ultraviolet ray irradiation, or the like in the atmosphere including oxygen. Furthermore, the oxide film 812 may be separately formed by the plasma CVD method, the sputtering method, the vapor deposition method, or the like.

A semiconductor film 813 for the gettering in which the noble gas element is added at a density of $1 \times 10^{20}$ atoms/cm$^3$ or more is formed in thickness from 25 nm to 250 nm on the oxide film 812 by the sputtering method. It is desirable that the mass density of the semiconductor film 813 for the gettering is lower than that of the crystalline semiconductor film 811 in order to increase the selecting ratio to the crystalline semiconductor film 811 in the etching process. As the noble gas element, one kind or plural kinds selected from the group consisting of helium (He), neon (Ne), argon (Ar), krypton (Kr), and xenon (Xe) are used.

Next, the gettering is performed by a heat treatment using a furnace annealing method or an RTA method. When the furnace annealing method is employed, the heat treatment is performed for 0.5 to 12 hours at temperatures ranging from 450 to 600° C. in the atmosphere of nitrogen. When the RTA method is employed, a lamp light source for heating is turned on for 1 to 60 seconds, preferably for 30 to 60 seconds, which is repeated from 1 to 10 times, preferably from 2 to 6 times. The luminance intensity of the lamp light source is determined so that the semiconductor film is heated instantaneously at temperatures ranging from 600 to 1000° C., preferably from 700 to 750° C.

By the heat treatment, the catalyst element inside the crystalline semiconductor film 811 moves to the semiconductor film 813 for the gettering due to the diffusion as indicated by an arrow, and the catalyst element is thus gettered.

Next, the semiconductor film 813 for the gettering is removed by etching selectively. The etching can be performed by dry etching using ClF$_3$ without using plasma or by wet etching using an alkali solution such as a solution including hydrazine or tetraethylammonium hydroxide (chemical formula (CH$_3$)$_4$NOH). On this occasion, the oxide film 812 can prevent the crystalline semiconductor film 811 from being etched.

Figure 8D:
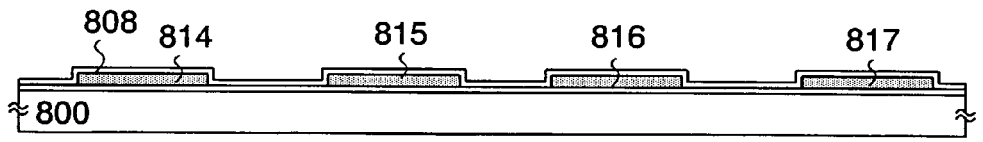

Next, after the oxide film 812 is removed by hydrofluoric acid, the crystalline semiconductor film 811 is patterned to form island-shaped semiconductor layers 814 to 817 (FIG. 8D). After that, a gate insulating film 808 covering the island-shaped semiconductor layers 814 to 817 is formed. For example, an insulating film including silicon formed in thickness from 30 to 200 nm by the sputtering method may be used as the gate insulating film 808.

It is noted that the gettering method is not limited to that shown in this embodiment. Another method may be employed to decrease the catalyst element in the semiconductor film.

Figure 9A:
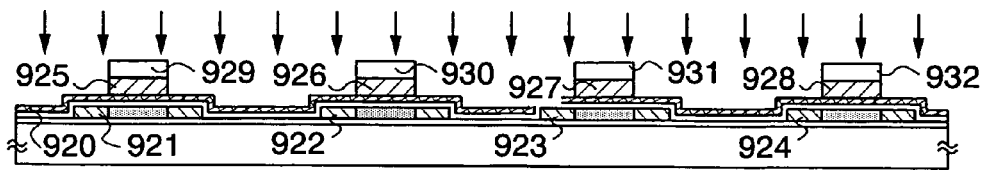
FIGS. 9A to 9E are cross-sectional views for showing a manufacturing process of a thin film transistor.

Subsequently, a first conductive film 920 is formed of a known conductive material such as an element selected from the group consisting of Ta, W, Ti, Mo, Al, Cu, Cr and Nd; a chemical compound material or an alloy material including the above element as its main component; a semiconductor film, typically a poly-crystalline silicon film, with the impurity element such as phosphorus doped; or AgPdCu alloy. The film thickness of the first conductive film 920 is in the range of 20 to 100 nm (FIG. 9A). Next, a second conductive film is formed in thickness from 100 to 400 nm and a silicon nitride film is formed thereon in thickness from 100 to 400 nm so that they cover the first conductive film 920. Subsequently, the silicon nitride film is patterned to form insulating layers 929 to 932. It is noted that not only silicon nitride but also silicon oxide may be used as the material of the insulating layers 929 to 932. More specifically, when the silicon oxide film is used, the insulating layers are formed by patterning the silicon oxide film using a phosphoric etchant. When the silicon nitride film is used, the insulating layers are formed by patterning the silicon nitride film using a hydrofluoric acid etchant. Next, conductive layers 925 to 928 are formed by patterning the second conductive film using the insulating layers 929 to 932 as a mask.

Then, a doping process is performed. In this process, an impurity element imparting n-type and belonging to 15th group such as phosphorous or arsenic is doped in the semiconductor layers 814 to 817 at low density. On this occasion, the conductive layers 925 to 928 and the insulating layers 929 to 932 become the mask against the impurity element imparting n-type. Thus, impurity regions 921 to 924 are formed in a self-aligning manner in which the density of the impurity element imparting n-type ranges from $1 \times 10^{18}$ to $1 \times 10^{20}$ atoms/cm$^3$.

Figure 9B:
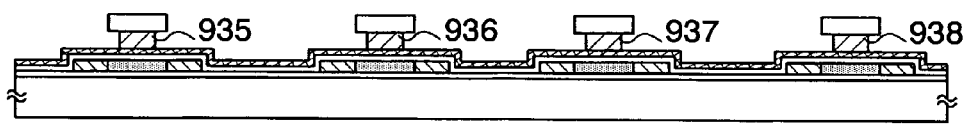
Figure 9C:
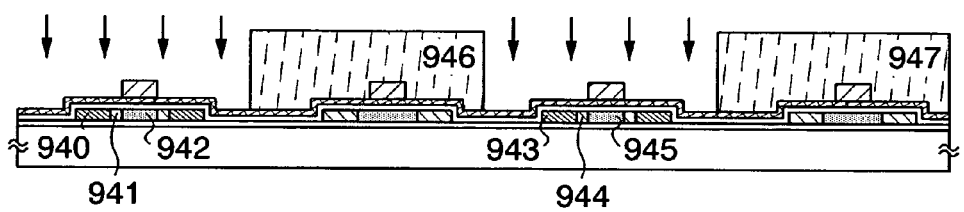

Anisotropic side etching is performed to roll back the conductive layers 925 to 928 and to form conductive layers 935 to 938 (FIG. 9B). After that, the insulating layers 929 to 932 functioning as the mask are etched away (FIG. 9C). Subsequently, resist masks 946 and 947 are formed and a doping process is performed at higher accelerating voltage than that in the above doping process. When the doping process is performed using the conductive layers 935 and 937 as the mask, the impurity element is added at the density from $1\times10^{18}$ to $5\times10^{19}$ atoms/cm$^3$ in impurity regions 941 and 944 (N$^-$ region, LDD region) and the impurity element imparting n-type is added at the density from $1\times10^{19}$ to $5\times10^{21}$ atoms/cm$^3$ in impurity regions 940 and 943 (N$^+$ region, LDD region). Moreover, channel-forming regions 942 and 945 are formed.

Figure 9D:
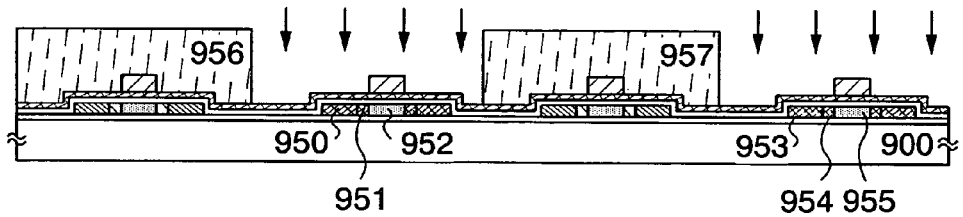

Next, after removing the resist masks 946 and 947, new resist masks 956 and 957 are formed (FIG. 9D). After that, a doping process is performed, and an impurity region in which an impurity element imparting the conductivity type opposite to the above conductivity type is added is formed in the semiconductor layer that becomes an active layer of the p-channel TFT. In this process, an impurity element imparting p-type is added using the conductive layers 936 and 938 as the mask, and impurity regions (P$^+$ region) 950 and 953, impurity regions (P$^-$ region) 951 and 954, and channel-forming regions 952 and 955 are formed in a self-aligning manner. This doping process is performed so that the density of the impurity imparting p-type of the impurity regions (P$^+$ region) 950 and 953 ranges from $1\times10^{19}$ to $5\times10^{21}$ atoms/cm$^3$. The conditions of the doping process are not limited to those described above, and the doping process may be performed twice or more.

Figure 9E:
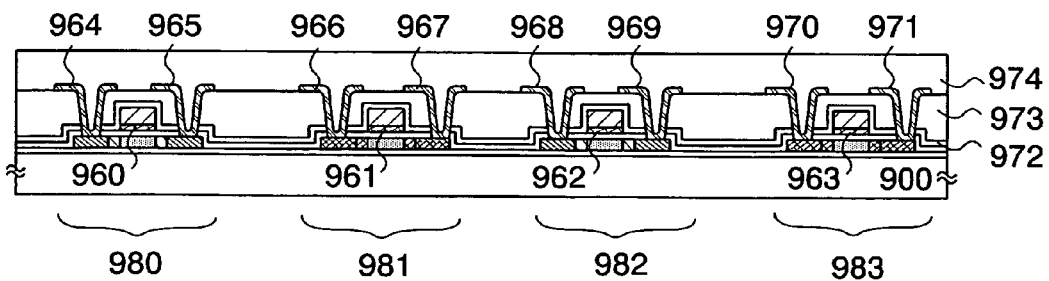

Next, the resist masks 956 and 957 are removed, and the first conductive film 920 is etched anisotropically using the conductive layers 935 to 938 as the mask to form conductive layers 960 to 963 (FIG. 9E). The above processes can form n-channel transistors 980 and 982 and p-channel transistors 981 and 983 over the same substrate.

Then, an insulating film 972 is formed as a protective film. The insulating film 972 is formed of a single layer or a multilayer of an insulating film including silicon in thickness from 100 to 200 nm by a plasma CVD method or a sputtering method. In this embodiment, the insulating film 972 is formed of a silicon oxynitride film in 100 nm thick by the plasma CVD method. After that, a heat treatment may be performed in order to recover the crystallinity of the semiconductor layer or to activate the impurity element added in the semiconductor layer.

Next, an organic insulating film 973 is formed on the insulating film 972. The organic insulating film 973 is formed of a silicon oxide film formed by an SOG (Spin On Glass) method or formed of an organic insulating film such as polyimide, polyamide, BCB, or acrylic. It is preferable to use a film that can be easily flattened as the organic insulating film 973 because the organic insulating film is formed in order to relax the concavity and convexity due to the TFT formed over the substrate 900 and to flatten them.

Next, a contact hole that reaches the impurity regions 940, 943, 950, and 953 is formed by patterning the insulating film 972 and the organic insulating film 973 according to a photolithography method. Then, a conductive film is formed of a conductive material, and wirings 964 to 971 are formed by patterning the conductive film. After that, an insulating film 974 is formed as a protective film. Thus, a semiconductor device illustrated in the figure is obtained.

It is preferable that the transistor used for a functional circuit such as a driver or a CPU has an LDD structure or a structure in which the LDD overlaps the gate electrode. For higher-speed operation, it is preferable that the transistor is miniaturized. Since the transistors 980 to 983 that are completed by the present embodiment have the LDD structure, they are preferably employed in the driver circuit requiring the high-speed operation. Moreover, with the miniaturization, it is necessary to make the gate insulating film 808 thinner. In the present embodiment, the doping process is performed under the condition where the gate insulating film 808 is covered by the first conductive film 920, and therefore the gate insulating film 808 is protected. As a result, the manufacturing method the present embodiment is also effective to miniaturize the transistor.

Embodiment 4

This embodiment explains a semiconductor device in which an active matrix type display device including a TFT circuit according to the present invention is incorporated with reference to FIGS. 11, 12 and 13.

As the example of such a semiconductor device, a personal digital assistant (such as an electronic book, a mobile computer, a cellular phone and the like), a video camera, a still camera, a digital camera, a personal computer, a television and the like are given. FIGS. 11, 12 and 13 show these examples.

Figure 11A:
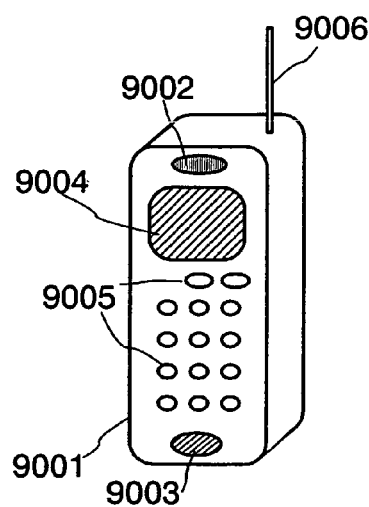
FIGS. 11A to 11E are drawings for showing electronic appliances to which the present invention can be applied.

FIG. 11A shows a cellular phone, including a main body 9001, a voice output portion 9002, a voice input portion 9003, a display device 9004, operating switches 9005, and an antenna 9006. The present invention can be applied to the voice output portion 9002, the voice input portion 9003, and the display device 9004 equipped with the active matrix substrate.

Figure 11B:
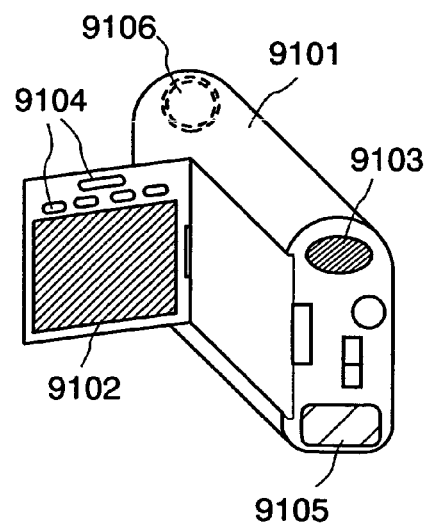

FIG. 11B shows a video camera, including a main body 9101, a display device 9102, a voice input portion 9103, operating switches 9104, a battery 9105, and an image receiver 9106. The present invention can be applied to the voice input portion 9103, the display device 9102 equipped with the active matrix substrate, and the image receiver 9106.

Figure 11C:
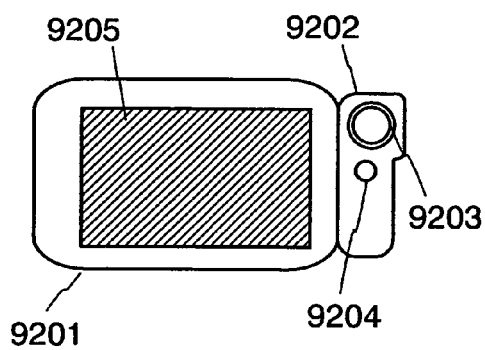

FIG. 11C shows a mobile computer or a personal digital assistant, including a main body 9201, a camera portion 9202, an image receiver 9203, an operating switch 9204, and a display device 9205. The present invention can be applied to the image receiver 9203 and the display device 9205 equipped with the active matrix substrate.

Figure 11D:
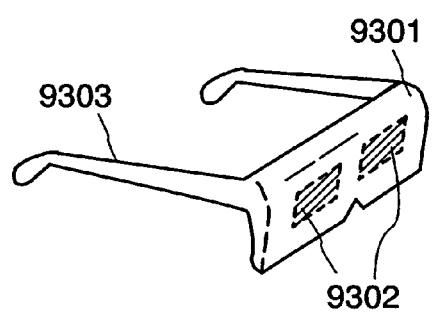

FIG. 11D shows a goggle type display, including a main body 9301, a display device 9302, and an arm portion 9303. The present invention can be applied to the display device 9302. In addition, it can be applied to other signal controlling circuits though they are not shown.

Figure 11E:
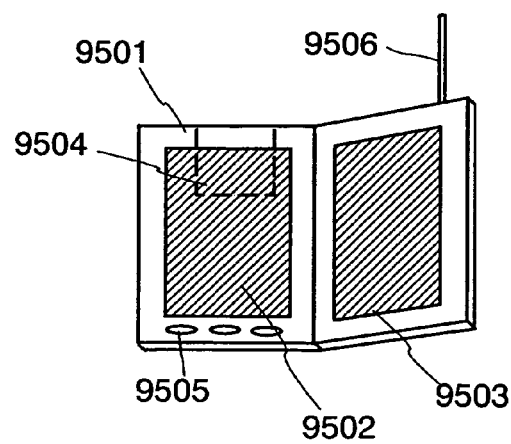

FIG. 11E shows a mobile book, including a main body 9501, display devices 9502 and 9503, a recording medium 9504, an operating switch 9505, and an antenna 9506. The mobile book is to display the data recorded in a minidisk (MD) and DVD or the data received with the antenna. The present invention can be applied to the display devices 9502 and 9503, which are direct view.

Figure 12A:
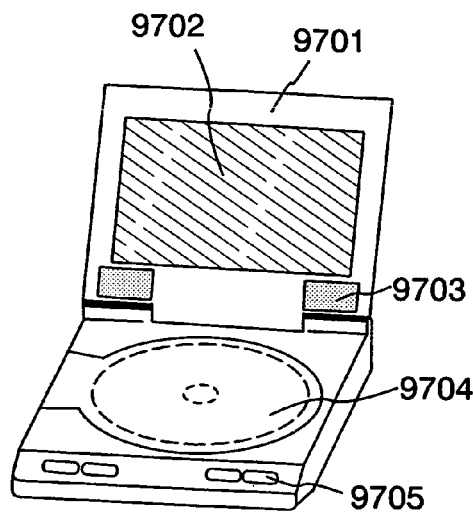
FIGS. 12A to 12C are drawings for showing electronic appliances to which the present invention can be applied.

FIG. 12A shows a player utilizing a recording medium that has a program recorded (hereinafter referred to as a recording medium) including a main body 9701, a display device 9702, a speaker portion 9703, a recording medium 9704, and an operating switch 9705. It is noted that this player makes it possible to enjoy listening to the music, watching the movies, playing the game, and playing on the Internet using a DVD (Digital Versatile Disc), CD or the like as its recording medium.

Figure 12B:
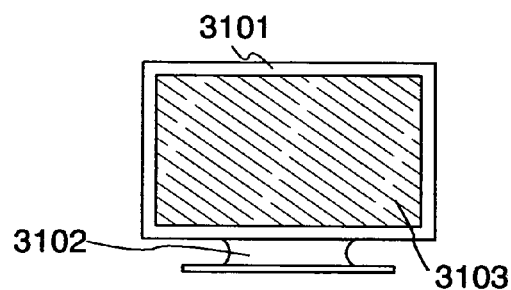

FIG. 12B shows a television, including a main body 3101, a supporting stand 3102, and a display portion 3103.

Figure 12C:
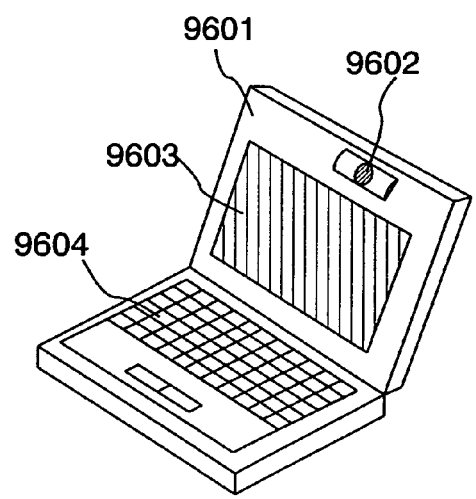

FIG. 12C shows a personal computer, including a main body 9601, an image input portion 9602, a display device 9603, and a keyboard 9604.

Figure 13A:
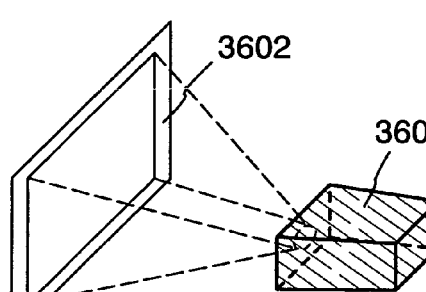
FIGS. 13A to 13D are drawings for showing electronic appliances to which the present invention can be applied.

FIG. 13A shows a front projector, including a projection device 3601, and a screen 3602. The present invention can be applied to a display device and other signal controlling circuits.

Figure 13B:
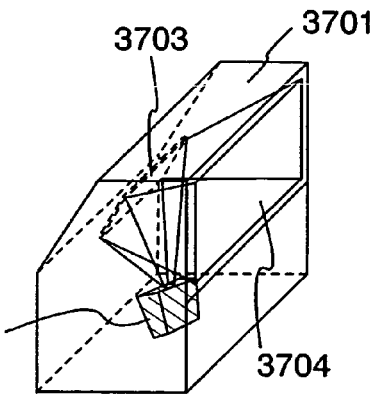

FIG. 13B shows a rear projector, including a main body 3701, a projection device 3702, a mirror 3703, and a screen 3704. The present invention can be applied to a display device and other signal controlling circuits.

Figure 13C:
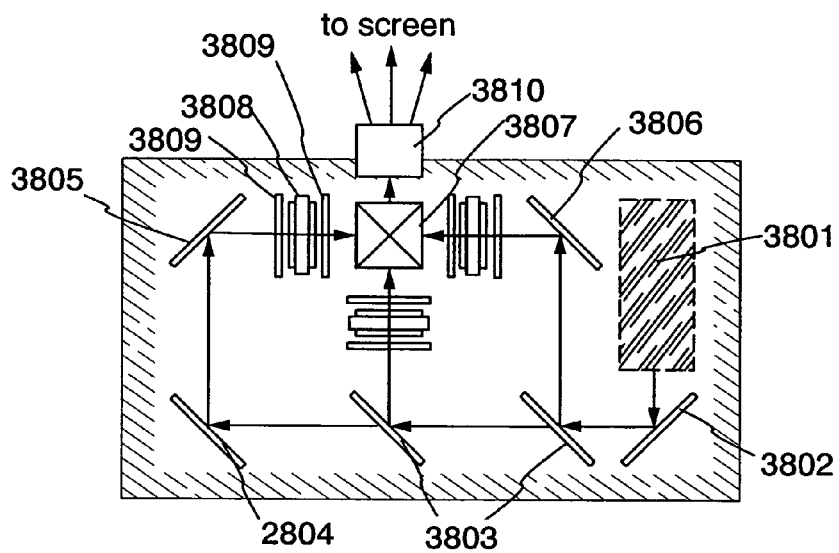

It is noted that FIG. 13C is a drawing to show an example of the structure of the projection device 3601 in FIG. 13A and the projection device 3702 in FIG. 13B. The projection devices 3601 and 3702 include an optical system of a light source 3801, mirrors 3802, 3804 to 3806, a dichroic mirror 3803, a prism 3807, a liquid crystal display device 3808, a wave plate 3809, and a projection optical system 3810. The projection optical system 3810 has an optical system including a projection lens. This example showed the projection device of three-plate type, but there is no limitation on this, and the projection device of single-plate type is also acceptable. Moreover, the practitioner may arbitrarily arrange an optical system such as an optical lens, a film having a polarizing function, a film for adjusting phase contrast, an IR film or the like in the optical path shown by an arrow in FIG. 13C.

Figure 13D:
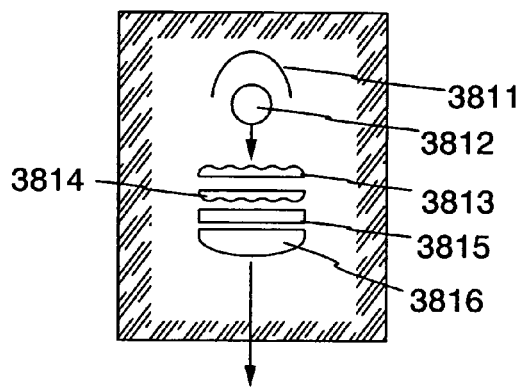

Moreover, FIG. 13D shows an example of the structure of the optical system of light source 3801 in FIG. 13C including a reflector 3811, a light source 3812, lens arrays 3813, 3814, a polarization changing element 3815, and a converging lens 3816. It is noted that the optical system of light source shown in FIG. 13D is just one of the examples, and there is no particular limitation to that described above. For example, the practitioner may provide an optical system such as an optical lens, a film having a polarizing function, a film for adjusting phase contrast, an IR film or the like in the optical system of the source appropriately.

Furthermore, the present invention can be also applied to a display element of light-emitting type. As described above, the present invention can be applied to various kinds of devices, and can be applied to the electronics device in every field. It is noted that the electronics device in this embodiment can be freely combined with any of the embodiments 1 to 3.

The thin film transistor manufactured thus has the semiconductor film annealed homogeneously by applying the present invention in which the operating characteristic and the reliability are sufficient. As described above, since a misalignment of the laser beam from the predetermined position due to the maintenance of an inside of a laser oscillator can be corrected easily in short time, which leads to increase throughput.

This application is based on Japanese Patent Application serial no. 2003-390573 filed in Japan Patent Office on 20th, November, 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A method for manufacturing a semiconductor device comprising the steps of:

forming a non-single crystal semiconductor film over a substrate; and performing laser annealing to the non-single crystal semiconductor film, wherein the laser annealing step comprises the steps of:

moving a laser beam emitted from a laser oscillator parallel by a first optical system having one optical element; and homogenizing an intensity distribution of the laser beam by a second optical system, wherein a misalignment of the laser beam from a predetermined position is corrected in such a way that the first optical system rotates on a straight line perpendicular to the traveling direction of the laser beam.

2. A method for manufacturing a semiconductor device comprising the steps of:

forming a non-single crystal semiconductor film over a substrate; and performing laser annealing to the non-single crystal semiconductor film, wherein the laser annealing step comprises:

recording a predetermined position of a laser beam emitted from a laser oscillator;

detecting a misalignment of the laser beam from a predetermined position;

keeping the laser beam in the predetermined position by moving the laser beam parallel with the use of a first optical system having one optical element; and homogenizing an intensity distribution of the laser beam on an irradiated surface by a second optical system, wherein the misalignment of the laser beam from the predetermined position is corrected in such a way that the first optical system rotates on a straight line perpendicular to a traveling direction of the laser beam.

3. The method for manufacturing a semiconductor device according to claim 1, wherein the misalignment of the laser beam from the predetermined position is corrected in such a way that the first optical system rotates on a straight line parallel to the traveling direction of the laser beam.

4. The method for manufacturing a semiconductor device according to claim 2, wherein the misalignment of the laser beam from the predetermined position is corrected in such a way that the first optical system rotates on a straight line parallel to the traveling direction of the laser beam.

5. The method for manufacturing a semiconductor device according to claim 1;

wherein the first optical system is provided between the laser oscillator and the second optical system.

6. The method for manufacturing a semiconductor device according to claim 2;

wherein the first optical system is provided between the laser oscillator and the second optical system.

7. The method for manufacturing a semiconductor device according to claim 2, wherein a CCD camera is used to record the predetermined position of the laser beam and to detect the misalignment of the laser beam from the predetermined position.

8. The method for manufacturing a semiconductor device according to claim 1, wherein the laser oscillator is a continuous wave or pulsed gas laser.

9. The method for manufacturing a semiconductor device according to claim 2, wherein the laser oscillator is a continuous wave or pulsed gas laser.

10. A method for manufacturing a semiconductor device comprising the steps of:
forming a non-single crystal semiconductor film over a substrate; and
performing laser annealing to the non-single crystal semiconductor film,
wherein the laser annealing step comprises:
moving a laser beam emitted from a laser oscillator parallel by a light-transmitting parallel flat plate; and
homogenizing an intensity distribution of the laser beam on an irradiated surface by an optical system,
wherein a misalignment of the laser beam from the predetermined position is corrected in such a way that the light-transmitting parallel flat plate rotates on a straight line perpendicular to the traveling direction of the laser beam.

11. A method for manufacturing a semiconductor device comprising the steps of:
forming a non-single crystal semiconductor film over a substrate; and
performing laser annealing to the non-single crystal semiconductor film,
wherein the laser annealing step further comprises:
recording a predetermined position of a laser beam emitted from a laser oscillator;
detecting a misalignment of the laser beam from the predetermined position;
keeping the laser beam in the predetermined position by moving the laser beam parallel with the use of a light-transmitting parallel flat plate; and
homogenizing an intensity distribution of the laser beam on an irradiated surface by an optical system,
wherein the misalignment of the laser beam from the predetermined position is corrected in such a way that the light-transmitting parallel flat plate rotates on a straight line perpendicular to a traveling direction of the laser beam.

12. The method for manufacturing a semiconductor device according to claim 10,
wherein the misalignment of the laser beam from the predetermined position is corrected in such a way that the light-transmitting parallel flat plate rotates on a straight line parallel to the traveling direction of the laser beam.

13. The method for manufacturing a semiconductor device according to claim 11,
wherein the misalignment of the laser beam from the predetermined position is corrected in such a way that the light-transmitting parallel flat plate rotates on a straight line parallel to the traveling direction of the laser beam.

14. The method for manufacturing a semiconductor device according to claim 10,
wherein the light-transmitting parallel flat plate is provided between the laser oscillator and the optical system.

15. The method for manufacturing a semiconductor device according to claim 11,
wherein the light-transmitting parallel flat plate is provided between the laser oscillator and the optical system.

16. The method for manufacturing a semiconductor device according to claim 11,
wherein a CCD camera is used to record the predetermined position of the laser beam and to detect the misalignment of the laser beam from the predetermined position.

17. The method for manufacturing a semiconductor device according to claim 10,
wherein the laser oscillator is a continuous wave or pulsed gas laser.

18. The method for manufacturing a semiconductor device according to claim 11,
wherein the laser oscillator is a continuous wave or pulsed gas laser.

19. The method for manufacturing a semiconductor device according to claim 10,
wherein the light-transmitting parallel flat plate is a flat glass.

20. The method for manufacturing a semiconductor device according to claim 11,
wherein the light-transmitting parallel flat plate is a flat glass.

21. The method for manufacturing a semiconductor device according to claim 1,
wherein the semiconductor device is applied to an electronic apparatus selected from the group consisting of a personal digital assistant, a video camera, a still camera, a digital camera, a personal computer, a television, a goggle type display, a mobile book, a player utilizing a recording medium, a front projector and a rear projector.

22. The method for manufacturing a semiconductor device according to claim 2,
wherein the semiconductor device is applied to an electronic apparatus selected from the group consisting of a personal digital assistant, a video camera, a still camera, a digital camera, a personal computer, a television, a goggle type display, a mobile book, a player utilizing a recording medium, a front projector and a rear projector.

23. The method for manufacturing a semiconductor device according to claim 10,
wherein the semiconductor device is applied to an electronic apparatus selected from the group consisting of a personal digital assistant, a video camera, a still camera, a digital camera, a personal computer, a television, a goggle type display, a mobile book, a player utilizing a recording medium, a front projector and a rear projector.

24. The method for manufacturing a semiconductor device according to claim 11,
wherein the semiconductor device is applied to an electronic apparatus selected from the group consisting of a personal digital assistant, a video camera, a still camera, a digital camera, a personal computer, a television, a goggle type display, a mobile book, a player utilizing a recording medium, a front projector and a rear projector.

25. A method for manufacturing a semiconductor device comprising the steps of:
forming a semiconductor film over a substrate;
generating a laser beam from a laser oscillator propagating along a first optical path;
passing the laser beam through a first optical system so that the laser beam propagates along a second optical path after passing through the first optical system to correct a misalignment of the laser beam from a predetermined position by rotating the first optical system on a straight line perpendicular to the first optical path;

homogenizing an intensity distribution of the laser beam by a second optical system; and irradiating the semiconductor film with the homogenized laser beam.

26. The method for manufacturing a semiconductor device according to claim 25, wherein the first optical path and the second optical path are not collinear.

27. The method for manufacturing a semiconductor device according to claim 25, wherein the first optical system is a flat glass.

28. The method for manufacturing a semiconductor device according to claim 25, wherein the semiconductor device is applied to an electronic apparatus selected from the group consisting of a personal digital assistant, a video camera, a still camera, a digital camera, a personal computer, a television, a goggle type display, a mobile book, a player utilizing a recording medium, a front projector and a rear projector.

* * * * *

UNITED STATES PATENT AND TRADEMARK OFFICE
CERTIFICATE OF CORRECTION

| | | |
|---|---|---|
| PATENT NO. | : 7,374,985 B2 | Page 1 of 1 |
| APPLICATION NO. | : 10/989341 | |
| DATED | : May 20, 2008 | |
| INVENTOR(S) | : Koichiro Tanaka | |

It is certified that error appears in the above-identified patent and that said Letters Patent is hereby corrected as shown below:

Col 20 lines 65-66 Claim 25, delete "to a misalignment of the laser beam for a predetermined position".

Signed and Sealed this

Fourth Day of November, 2008

JON W. DUDAS
*Director of the United States Patent and Trademark Office*